(12) United States Patent
Schneider

(10) Patent No.: US 6,975,238 B2
(45) Date of Patent: Dec. 13, 2005

(54) SYSTEM AND METHOD FOR AUTOMATICALLY-DETECTING SOFT ERRORS IN LATCHES OF AN INTEGRATED CIRCUIT

(75) Inventor: Ronny Schneider, South Burlington, VT (US)

(73) Assignee: Infineon Technologies AG, (DE)

( * ) Notice: Subject to any disclaimer, the term of this patent is extended or adjusted under 35 U.S.C. 154(b) by 99 days.

(21) Appl. No.: 10/674,386

(22) Filed: Oct. 1, 2003

(65) Prior Publication Data

US 2005/0073345 A1    Apr. 7, 2005

(51) Int. Cl.[7] ............................................. G08B 21/00
(52) U.S. Cl. ........................ 340/635; 714/10; 714/800
(58) Field of Search ........................ 340/635; 714/10, 714/2, 42, 49, 800, 801, 802, 767

(56) References Cited

U.S. PATENT DOCUMENTS

| | | |
|---|---|---|
| 4,638,463 A | 1/1987 | Rockett, Jr. |
| 5,012,246 A | 4/1991 | Chung et al. |
| 5,881,078 A | 3/1999 | Hanawa et al. |
| 6,201,750 B1 | 3/2001 | Busch et al. |
| 6,366,132 B1 | 4/2002 | Karnik et al. |
| 6,373,771 B1 | 4/2002 | Fifield et al. |
| 6,380,781 B1 | 4/2002 | Karnik et al. |
| 6,507,928 B1 * | 1/2003 | Richardson ................. 714/800 |
| 6,543,028 B1 * | 4/2003 | Jamil et al. ................. 714/800 |
| 6,640,313 B1 * | 10/2003 | Quach .......................... 714/10 |
| 6,658,621 B1 * | 12/2003 | Jamil et al. ................. 714/805 |
| 6,760,881 B2 * | 7/2004 | Batson et al. ............... 714/773 |
| 6,785,847 B1 * | 8/2004 | Jordan et al. ................. 714/37 |

* cited by examiner

Primary Examiner—John Tweel, Jr.
(74) Attorney, Agent, or Firm—Edell, Shapiro & Finnan, LLC

(57) ABSTRACT

A circuit and method for detecting soft errors produced in latches. An exemplary embodiment of a circuit includes a block of concatenated latches, each latch having a comparator, with an output from the final latch comparator representing a parity bit for the latch block. The circuit further includes a element to store the block parity bit, and a comparator for the block parity bit and stored parity bit. A latch soft error is detected by monitoring an output from the parity bit comparator, which signals an error when the latch block parity bit changes state.

17 Claims, 11 Drawing Sheets

SYSTEM AND METHOD FOR AUTOMATICALLY-DETECTING SOFT ERRORS IN LATCHES OF AN INTEGRATED CIRCUIT

BACKGROUND OF THE INVENTION

1. Field of the Invention

The present invention relates generally to latch circuits in integrated circuits. More particularly, the present invention relates to systems and methods for detecting occurrences of soft errors that cause a latch to improperly change state, and thereby emit an incorrect data value.

2. Background Information

A technology generation in VLSI chips is defined in part by the dimensions of the average device spacing (L) between neighboring devices. With each new technology generation, L continues to decrease by about 30%, requiring a concomitant shrink in the size of devices. Together with the decrease in device size, a decrease has also occurred in the quantity of charge that is required to switch a transistor device or to retain voltage in a storage device in a circuit. For circuits that store information such as latches, static random access memory (SRAM) cells, or dynamic random access memory (DRAM) cells, the ability to retain the correct information during chip operation is paramount. For example, currently-manufactured semiconductor products are predominantly comprised of the successive 0.25 $\mu$m, 0.18 $\mu$m, and 0.13 $\mu$m technology generations. Strikingly, the amount of charge that represents a single data bit in a 0.25 $\mu$m technology generation SRAM is about sixteen times larger than that used in the 0.13 $\mu$m generation SRAM. As this trend continues, it will become necessary to improve devices and methods for sensing ("reading"), storing ("writing"), and protecting storage devices.

Even for the 0.13 $\mu$m technology generation, the amount of charge that is used to switch storage devices (switching charge) is sufficient to ensure proper reading and writing of data under normal chip operation. However, the switching charge is sufficiently low that protection of latches, SRAM, DRAM and other storage devices against corruption is a serious concern. This is in part due to the fact that several common radiation sources can produce levels of charge in excess of the switching charge. For instance, it is well known that protons, neutrons, alpha particles (a nucleus comprising two protons and two neutrons), and cosmic radiation in the ambient environment can generate significant charge in devices upon striking a VLSI chip. In materials used for manufacture of chips, such as plastics, metals and glasses, frequently there are found trace amounts of radioactive elements, which naturally occur as an embedded impurity. Such radioactive elements thus can be incorporated in the circuits or devices that comprise the VLSI chip. Upon radioactive decay, such elements may emit radiation such as alpha particles, which can produce a large track of displaced electrical charge after striking silicon in the chip. While the level of radioactive impurities can be reduced by careful monitoring of manufacturing materials, an added level of expense is required. In addition, other radiation sources are more difficult to avoid. Cosmic rays are a primary source of damaging radiation for VLSI chips, and are ubiquitous in the ambient environment. Because of their origin in the cosmos and their ability to penetrate matter, cosmic rays cannot be prevented from striking VLSI chips operating in machines located in typical office buildings, factories, homes, vehicles and other common work places.

A single strike event by cosmic radiation can readily generate a quantity of charge comparable to the current switching charge levels found in storage devices, thus rendering them susceptible to errors in retention of data. Such 'soft errors' do not cause permanent damage to the circuitry of the chip, but corrupt the data retained in devices, and make it necessary to re-program the device for the error to be corrected. For example, a silicon transistor inadvertently turned on by excess charge injected after radiation strike might discharge a storage node, which then would have to be re-charged.

There are several areas where data can be stored in a VLSI chip that are vulnerable to soft errors, particularly including latches that are used to retain the state of on-chip fuses. On-chip fuses are devices that can be permanently and irreversibly set, typically by destructive means where the conducting line in the fuse is broken. When the fuse is blown, it becomes non-conducting, such that the state corresponds to a logic 1. If the fuse is not blown, the logic state corresponds to logic 0. The state of each fuse can be read into a fuse latch through an output line from the fuse. FIG. 1 shows a typical latch for storing one bit of data, such as the state of an adjacent fuse. Fuse latch 1 is comprised of two coupled inverters 6 and 7, connected to fuse 2 through line 4 and load 3. The state of fuse 2 is stored at node 5 when the transistor of load 3 is turned on. For example, if latch 1 is preset so that node 5 is to equal logic 1, fuse 2 is blown, and when load 3 is turned on, node 5 takes on logic state 1. After the signal from node 5 (logic 1) enters inverter 6, it is output as logic 0 at node 8. Subsequently, if node 8 is output through inverter 7, the logic 1 value is restored at node 5. In this manner node 5 always reads logic 1 and node 8 logic 0.

To ensure that the correct latch state is preserved, accessing and setting fuse data in fuse latches can be performed during power up of the VLSI chip. During chip operation, which may continue for intervals equivalent to quadrillions of machine cycles, if a soft error were to occur in a given latch, the latch would retain an incorrect state during ongoing chip operation. Thus, soft errors generated in fuse latches during operation could remain uncorrected for quadrillions of cycles, resulting in an increased probability that latch-dependent devices or circuitry will malfunction.

One manner of addressing this problem is to design latches that are resistant or immune to switching by events such as cosmic radiation impact. Examples of related art include soft-error tolerant latches and latch circuits, which are discussed in U.S. Pat. Nos. 6,380,781 and 6,366,132. In the former reference, the geometry of the transistor in the latch circuitry is modified, including reduction of the relative size of a doped silicon source/drain (S/D) region. In this manner, it is intended that the likelihood of soft errors induced by ionizing radiation will be lessened, since it is known that a radiation strike in the S/D region results in a higher probability of creating charge that will flip the device, as opposed to the polysilicon gate region, for example. However, as is well-known to those skilled in the art, for a given circuit element size, the S/D region cannot be decreased drastically without adversely affecting device or circuit performance, so S/D regions in practical devices still will occupy a sufficient area to be susceptible to radiation. In the latter reference, examples are given where extensive additional circuitry is added to each latch to prevent a soft error from propagating to the outside circuitry of the chip. However, in many chip designs, where device density is high, it may be difficult to add such extensive circuitry for each latch. This is especially true in the case of DRAM chips.

Alternatively, the adverse impact of soft errors that occur in latches could be reduced by frequent readout of latch information, so that the period where the errors remain uncorrected is minimized. However, for fuse latches, where the state of permanently written fuse data can be accessed, frequent data readout may cause excessive current to be drawn through areas containing intact or imperfectly blown fuses. Additionally, voltage applied during read operations may alter the blown fuse properties, leading to increased error probability when accessing data. Constant read out of fuse information from the fuses into the fuse latches within the chip could also slow down chip performance. In view of the aforementioned problems, it will be appreciated that a substantial need exists for an improved method to correct for soft errors in latches.

BRIEF SUMMARY OF THE INVENTION

Embodiments of the current invention provide a circuit for detection and correction of soft errors, particularly in latches. This affords the possibility of correcting for soft errors in a timely fashion, without requiring frequent reading of latches. A preferred embodiment of the present invention includes latch circuitry that produces an error signal upon occurrence of a soft error, and only sustains interrogation by an outside reset and readout operation on such occasions, thus drastically limiting the amount of necessary events where current is drawn to the fuse and fuse latches. This may be accomplished by embedding a parity bit within a circuit containing a block of connected fuse latches, which provides the method for signaling the occurrence of a soft error.

Embodiments of the present invention are additionally disclosed that provide a method for automatic reset and read-out of the local block of latches in which a soft error is generated, without requiring reading all latches throughout the chip. Using the parity bit to signal soft errors within the fuse block allows local correction operations to be performed without accessing other blocks within the chip.

A further embodiment of the present invention relates to a method for minimizing the impact of soft errors in latches on overall chip operation. The present invention accomplishes this by providing a method for automatically detecting soft errors when generated, determining the fuse block location of the error, and performing a local read to correct an errant block at an appropriate interval after an occurrence of a soft error, such that the re-reading of the latch block has minimum impact on other chip operations.

DETAILED DESCRIPTION OF THE INVENTION

Figure 1:
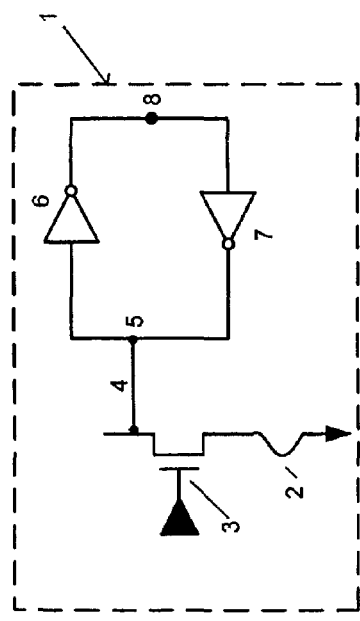
FIG. 1 is a schematic diagram of related art illustrating a known fuse latch circuit.

Before one or more embodiments of the invention are described in detail, one skilled in the art will appreciate that the invention is not limited in its application to the details of construction, the arrangements of components, and the arrangement of steps set forth in the following detailed description or illustrated in the drawings. The invention is capable of other embodiments and of being practiced or being carried out in various ways. Also, it is to be understood that the phraseology and terminology used herein is for the purpose of description and should not be regarded as limiting.

A preferred embodiment of the present invention includes a circuit to detect soft errors in fuse latches. The circuit is comprised of a block of successive fuse latch units. Each fuse latch unit is, in turn, comprised of a latch connected to a fuse on one side and a comparison unit (comparator) on the other side. Each latch stores the state of the fuse to which it is connected, indicating whether the fuse is blown (logic 1) or not blown (logic 0). The fuse state signal and its inverted signal are output to a comparator for the latch. The comparator, in turn, outputs a signal to the comparator of the successor latch unit. The output of the comparator within a given fuse latch unit is provided as an input to the comparator of the successor latch unit. The output of the comparator of the final fuse latch unit represents a parity bit for the block of latches. The parity bit, in turn, signals whether the total number of blown fuses in the block of latches is odd or even. When a latch upset occurs from a soft error, the stored state of the latch is reversed, e.g., from 1 to 0. This data is output to the comparator unit attached to the upset latch. When the signal is output from the last comparator unit in the latch block, the parity bit flips to signal that the number of blown fuses has changed from an odd number to an even number (or vice versa). This signal can be read by detectors external to the latch block and used to generate an operation to correct the latch error.

Figure 2:
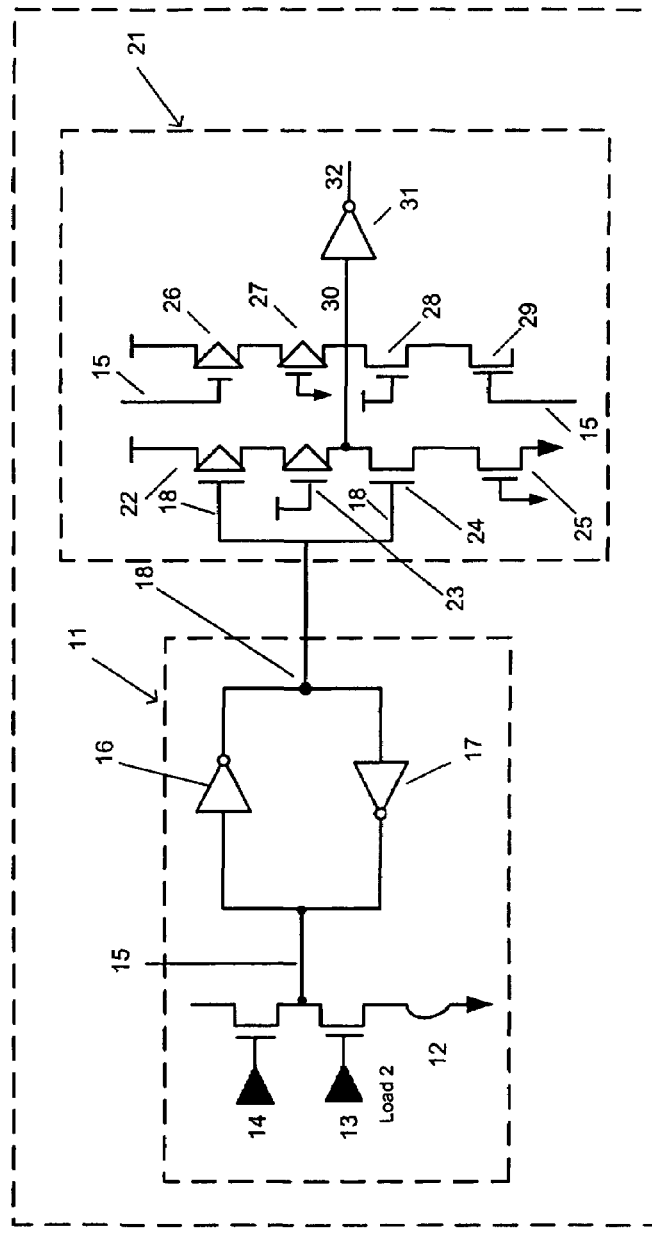
FIG. 2 is a schematic drawing illustrating a fuse latch and comparator, in accordance with an embodiment of the present invention.

FIGS. 2 to 6 illustrate a preferred embodiment of the present invention. Located in a plurality of regions in the chip are fuse latch blocks containing the features described herein. FIG. 2 shows a fuse latch unit 10, one of a plurality of successive latch units residing in the fuse block. Fuse latch 11 is comprised of coupled inverters as described above with reference to FIG. 1. Fuse 12 is connected to latch node 15 through load 13, which is a transistor. The state of latch node 15 is inverted at node 18, as described above for latch 1. In the present invention, both node 15 and node 18 are output to separate lines, comprising input nodes 15 and 18 in comparator 21. Comparator 21, comprised of transistors 22–29, outputs a signal from node 30 and its complement signal at node 32, which is obtained after passing from node 30 through inverter 31. Nodes 30 and 32 form inputs in a successor comparator 52 in the adjacent latch unit, shown in FIG. 3.

Figure 3:
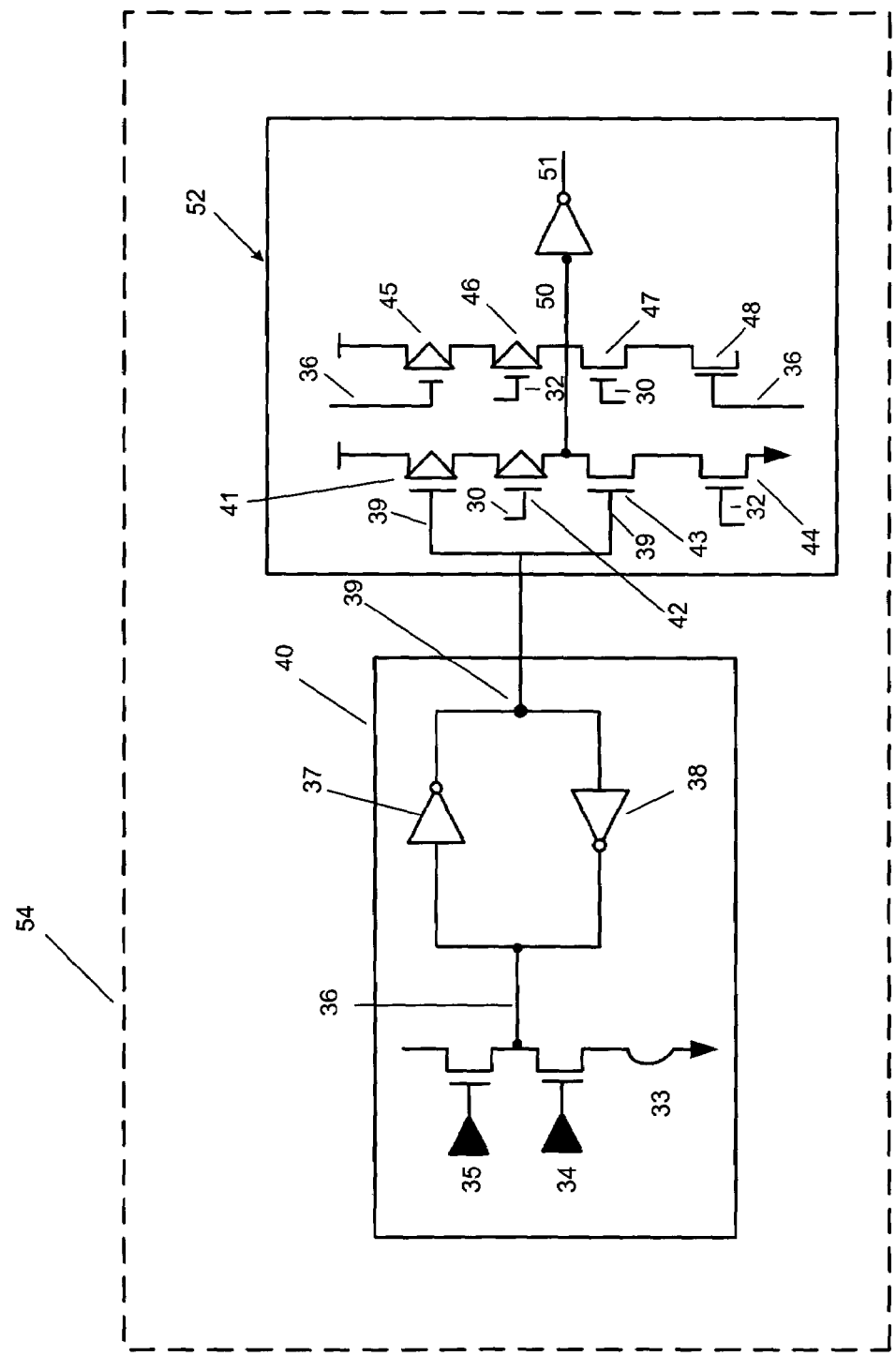
FIG. 3 is a schematic drawing illustrating a second fuse latch and comparator, in accordance with an embodiment of the present invention.

In the manner illustrated in FIG. 3, except for the first comparator, each comparator in the fuse block receives input from the preceding comparator and from the fuse latch located in the same latch unit. As shown in FIG. 3, a second fuse latch unit 54 is connected to fuse latch unit 10 via signal lines 30 and 32 of comparator 21. In the case where fuse 33 is blown, then node 36 in fuse latch 40 represents logic 1 and node 39 is at logic 0. In turn, comparator 52, comprised of transistors 41–48, sends output to a successive comparator from node 50, as well as its complement signal at node 51, which is derived by passing through inverter 53.

Figure 4:
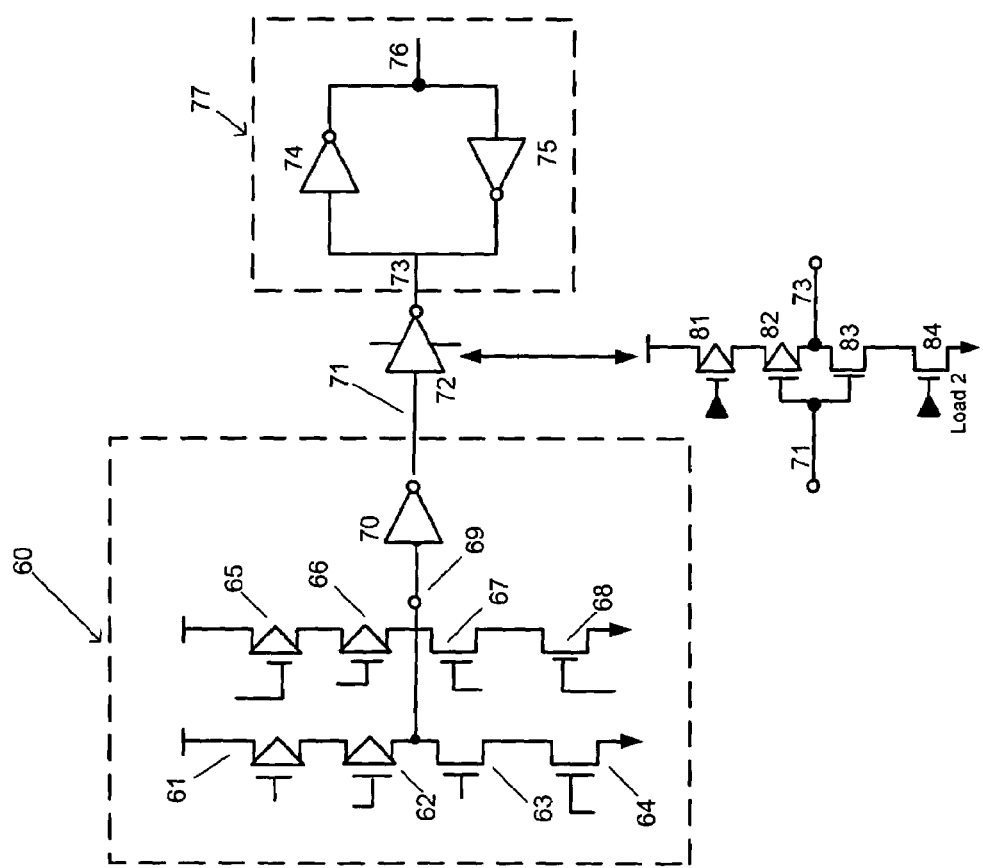
FIG. 4 is a schematic diagram illustrating the fuse block parity bit used for error detection, in accordance with an embodiment of the present invention.
Figure 5:
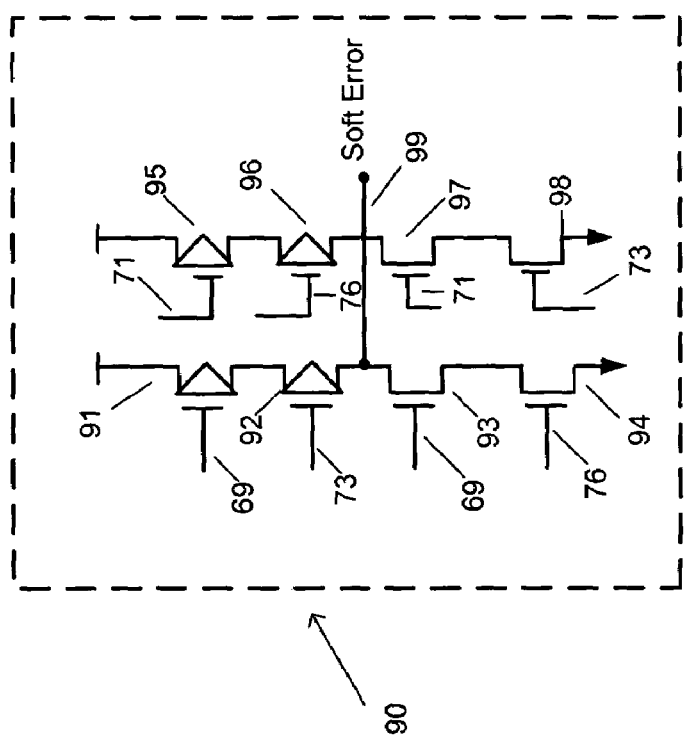
FIG. 5 illustrates a comparator used to determine a parity bit flip according to an embodiment of the present invention.

FIG. 4 shows final fuse latch comparator 60, comprised of transistors 61–68. The output signals from comparator 60 are the latch block parity bit 69, and inverse parity bit 71, formed by passing through inverter 70. As further illustrated in FIG. 4, the value of parity bit 69 can be stored by passing inverse parity bit 71 through gated inverter 72, comprised of transistors 81–84. The resulting node 73 is the inverse of the inverse of the parity bit, and thus represents the parity bit value. The parity bit value is stored in node 73 using parity bit latch 77 comprised of coupled inverters 74 and 75. The inverse of the stored parity bit is stored at node 76. Referring now to FIG. 5, parity bit node 69, inverse parity bit node 71, stored parity bit node 73, and inverse stored parity bit node 76 are output to a final comparator, the 'parity bit comparator,' 90. Comparator 90 is comprised of transistors 91–98 and is used to compare the parity bit and stored parity bit. The output 99 of comparator 90 is used to signal the occurrence of a soft error.

Figure 6:
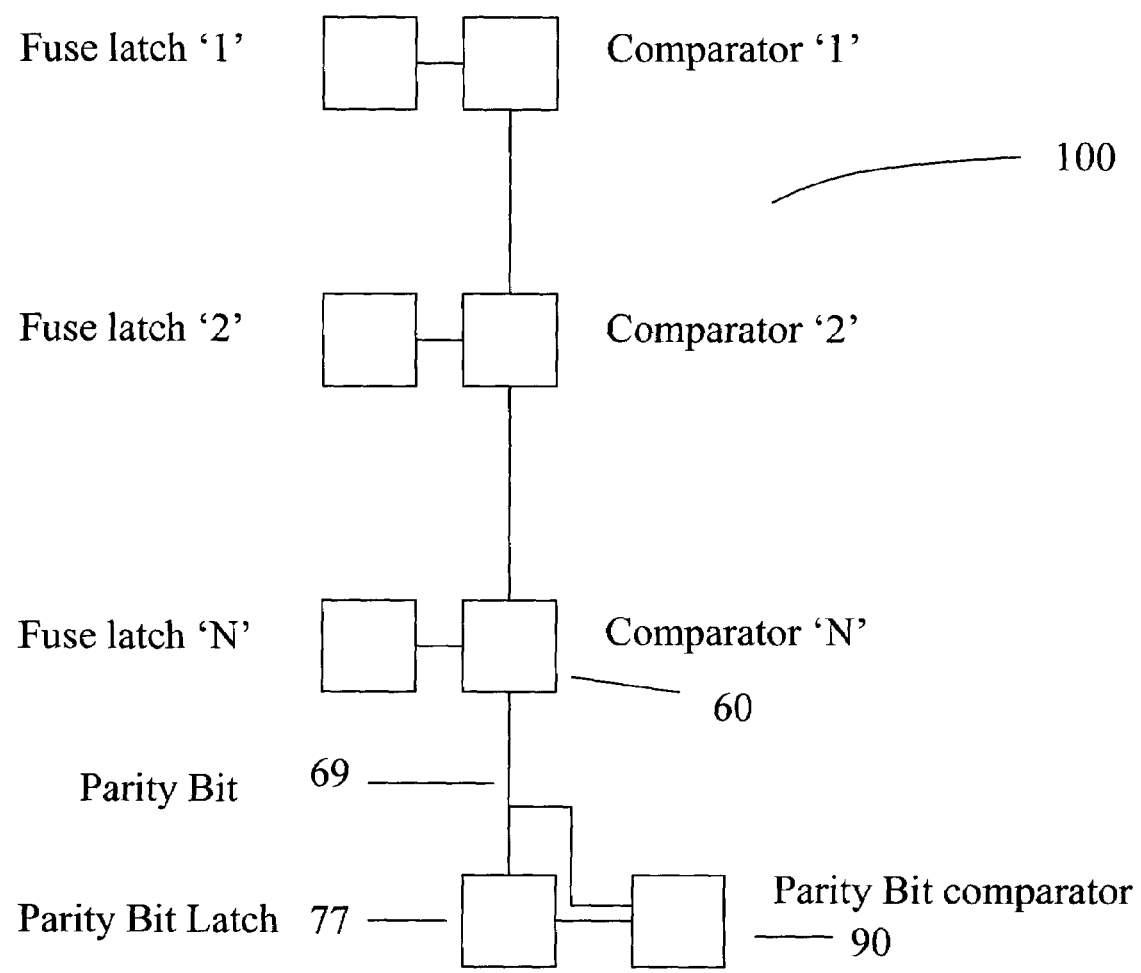
FIG. 6 is a schematic diagram of the latch block circuit according to an embodiment of the current invention.

FIG. 6 illustrates a global view of the entire group of circuits and devices described heretofore, comprising the fuse latch block 100 with built-in soft error detection. Fuse latch '1' and comparator '1' represent components of the first fuse latch unit, while fuse latch 'N' and comparator 'N' represent components of the last fuse latch unit. Comparator 'N' is equivalent to comparator 60 in FIG. 4.

Having described the circuitry for soft error detection, the electrical path of the soft error from its point of generation to the output at node 99 will be described. Referring again to FIG. 3, if a radiation strike occurs, for instance, in the region of the circuit near node 36, the transistors may be discharged such that the state of node 39 and 36 are flipped. For, instance, if node 36 originally was set at logic 0, it is flipped to logic 1, and node 39 is flipped to logic 0. Subsequently, the errant state of node 36 is output to comparator 52 at n-type field effect transistor (nFET) 48 and p-type field effect transistor (pFET) 45. Similarly, the errant state of node 39 is output to comparator 52 at nFET 43 and pFET 41. Node 30, which is output from the predecessor comparator 21 shown in FIG. 2, presumably sends the correct signal to nFET 47 and pFET 42. Similarly, node 32 from comparator 21 presumably outputs the correct signal to nFET 44 and pFET 46. However, taken in conjunction with the errant signals input to transistors 41, 43, 45 and 48, the output of comparator 52 at node 50, as well as its complement 51, are flipped, as described in more detail below.

If, under normal operation, node 30 from comparator 21 is at logic 1, then node 32 is at logic 0. Node 30 is received at nFET 47 and pFET 42, turning on the former and turning off the latter. Similarly, node 32 at logic zero will turn off nFET 44 and turn on pFET 46. Using the example above, with node 36 originally set at logic 0, pFET 45 is turned on, while nFET 48 is turned off. Node 39 is set at logic 1, causing pFET 41 to be turned off and nFET 43 to be turned on. With the source of pFET 45 at supply voltage Vdd, and both pFETs 45 and 46 turned on, node 50 is brought to logic 1 state (Vdd). If a soft error is registered at node 36, causing it to change to logic 1, then pFET 45 is turned off and nFET 48 is turned on. Similarly node 39 is switched to logic 0, causing pFET 41 to turn on and nFET 43 to turn off. With both nFETs 47 and 48 now turned on and nFET 48 source set at ground, node 50 is brought to logic 0. Thus, given that the inputs from comparator 21 do not change, a switch of state at node 36 and 39 (36/39) causes a switch at node 50.

Referring to comparator 52 in FIG. 3, it will be apparent to those skilled in the art that no matter what the state of inputs from node 30 and 32 (30/32) are, a switch of 36/39 will switch node 50. Similarly, in the case where fuse latch 40 does not sustain an error, but an error is generated in comparator 21 (FIG. 2) residing in the preceding latch, a switch at node 50 will occur. In the latter case, nodes 36 and 39 are stable, but a switch occurs at 30/32, which will induce a switch at node 50.

One skilled in the art will notice that each fuse latch comparator performs the XOR circuit function as shown by the following: If input 30=39 (and therefore 32=36 and 30≠36 and 32≠39) 50 is logic 1, because either 30=39=logic 0 or 32=36=logic 0. That is, if the gate inputs of the pFETs of pair 41/42 (corresponding to inputs 30/39) are the same, then the inputs of the pFETs in pair 45/46 (corresponding to inputs 32/36) must also be the same, and the inputs to nFETs in pair 47/48 (corresponding to inputs 30/36), as well as those in pair 43/44 (corresponding to inputs 39/32), must differ. Since either pFET pair 41/42 or 45/46 is turned on, node 50 is connected to Vdd (logic 1), through the turned on pair.

If 30=39 (and therefore 32=36 and 30=36 and 32=39), 50 is logic 0, because either 30=36=logic 1 or 32=39=logic 1. In other words, if the gate inputs to the pFETs of pair 41/42 (corresponding to inputs 30/39) are different, then the gate inputs to pFETs in pair 45/46 (corresponding to inputs 32/36) must also be different, and the inputs to nFETs in pair 47/48 (corresponding to inputs 30/36), as well as those in pair 43/44 (corresponding to inputs 39/32) must be the same. Whether pair 43/44 is turned on or 47/48 is turned on, node 50 is connected to ground (logic 0) through the turned on pair.

As discussed above, a change in either input pair from latch 40 or from comparator 21 will induce a switch in node 50. This behavior applies to every latch unit within the latch block of the current invention. Thus, once node 50/51 in latch unit 54 switches, the succeeding latch will register a switched input pair, which will cause a switch in its comparator output. Similarly, every succeeding comparator after latch unit 54 will receive a switched input from the comparator of the previous latch, finally resulting in a flip of the parity bit 69 in comparator 60.

Figure 7:
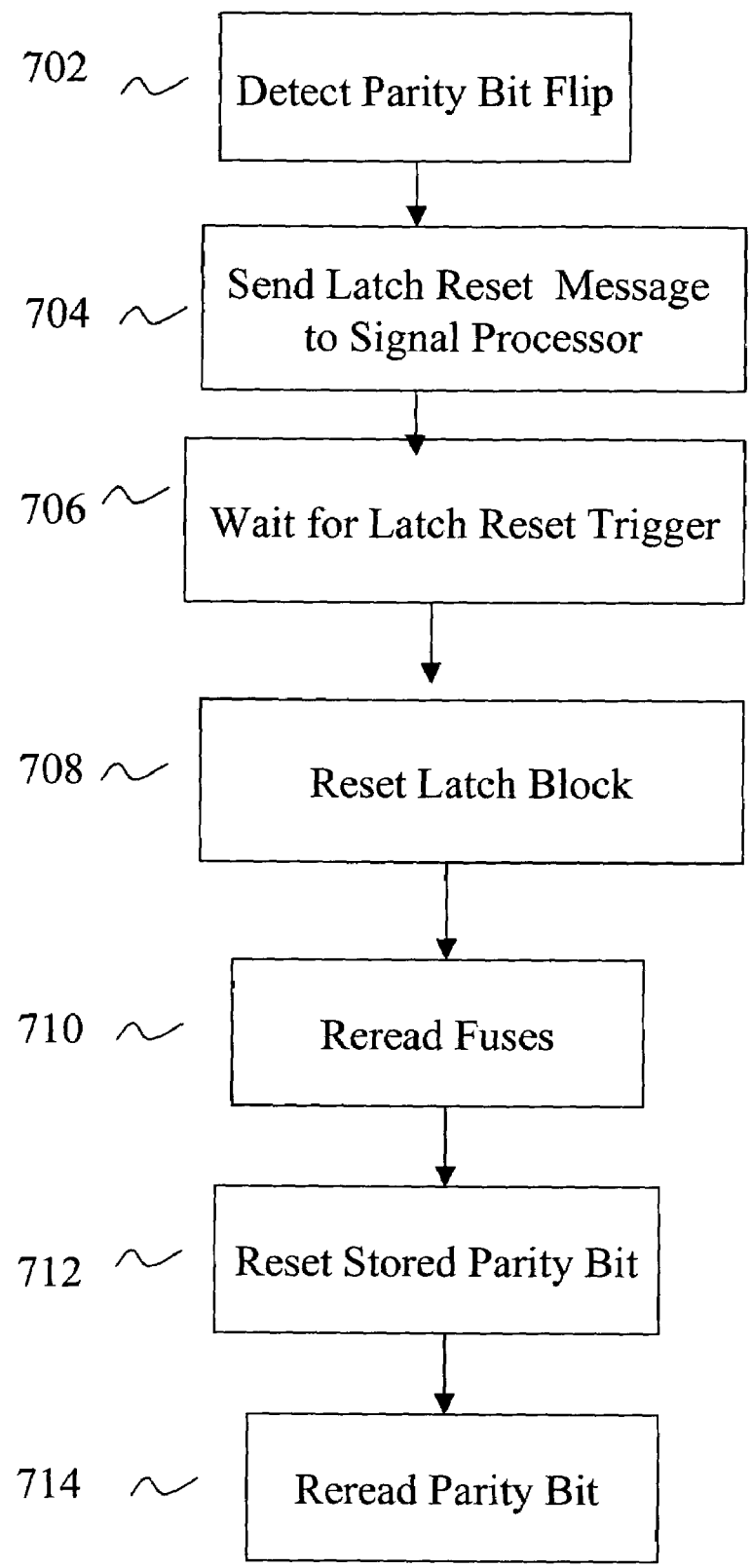
FIG. 7 is a diagram illustrating the sequence of events according to an embodiment of the present invention, including error detection, latch block reset, and re-read.

FIG. 7 illustrates an exemplary embodiment of the present invention, particularly a method of detecting and correcting latch errors. After a radiation strike causes a latch soft error, a detector placed next to comparator 90 detects that the latch block parity bit 69 has flipped at step 702, indicating a soft error in the latch block. In response, some type of signal processor is triggered. In one embodiment, a signal for reading out the errant fuse block is generated locally in the chip. After detecting the signal indicative of the parity bit error, at step 704, a local message is sent to a signal generator with instructions to reset the latch block, once a trigger is received. At step 706, the signal processor receives a trigger to generate a reset signal. At step 708, the signal generator resets the latch block using latch node 15 in latch 11, shown in FIG. 2. At this point, the latch may be reset to a default value, e.g. logic 1, by turning on load 14. Next, in step 710, fuse 12 is connected to latch node 15 by applying an appropriate voltage to the transistor at node 13, which restores the proper state. If the fuse in question is not blown, the latch is flipped upon reread. This process occurs for each latch unit in the block, and results in all errant latches being reset to their respective correct fuse values. At the same time at step 712, a signal is sent through nFET 81 to restore parity bit latch 77. Optionally, the stored parity bit 73 may then be reread in step 714 to establish that the parity bit and parity bit latch are restored to their correct settings, indicating that all the latches within the block are correctly set. For example, if the number of blown fuses in the block is odd, and after a soft error the number appears even, upon reread the parity bit and stored parity bit will again show an odd number of fuses blown.

An advantage of the invention is that it operates without knowledge required of the exact location of the soft error, within the plurality of latches defined by the block. That is, the same latch block parity bit error is signaled at comparator 90, regardless of the location of the errant latch within the block. Moreover, during correction operations of the fuse latch block, a reset signal is sent to a line common to all latches in the block, ensuring that the errant latch is reset without knowing its exact location. Finally, the rereading of the latch block parity bit from comparator 90 allows one to ensure that all the fuse latches are properly set, without knowledge of the position of the previously errant latch.

An additional advantage of the present invention is that errors are automatically detected upon occurrence, thus eliminating a need to frequently read the fuse blocks. Since one is assured that an error signal will be generated in the appropriate latch block, it is not necessary to frequently interrogate every latch block in order to ensure detection of a possible latch soft error. A further advantage is that it provides flexibility in performance of error correction. Because the time of soft error occurrence is known as a result of the parity bit flip, the error correction may be performed at an appropriately chosen interval following the soft error generation, based on considerations pertaining to overall operation of the chip or machine in which the fuse block resides.

Figure 8:
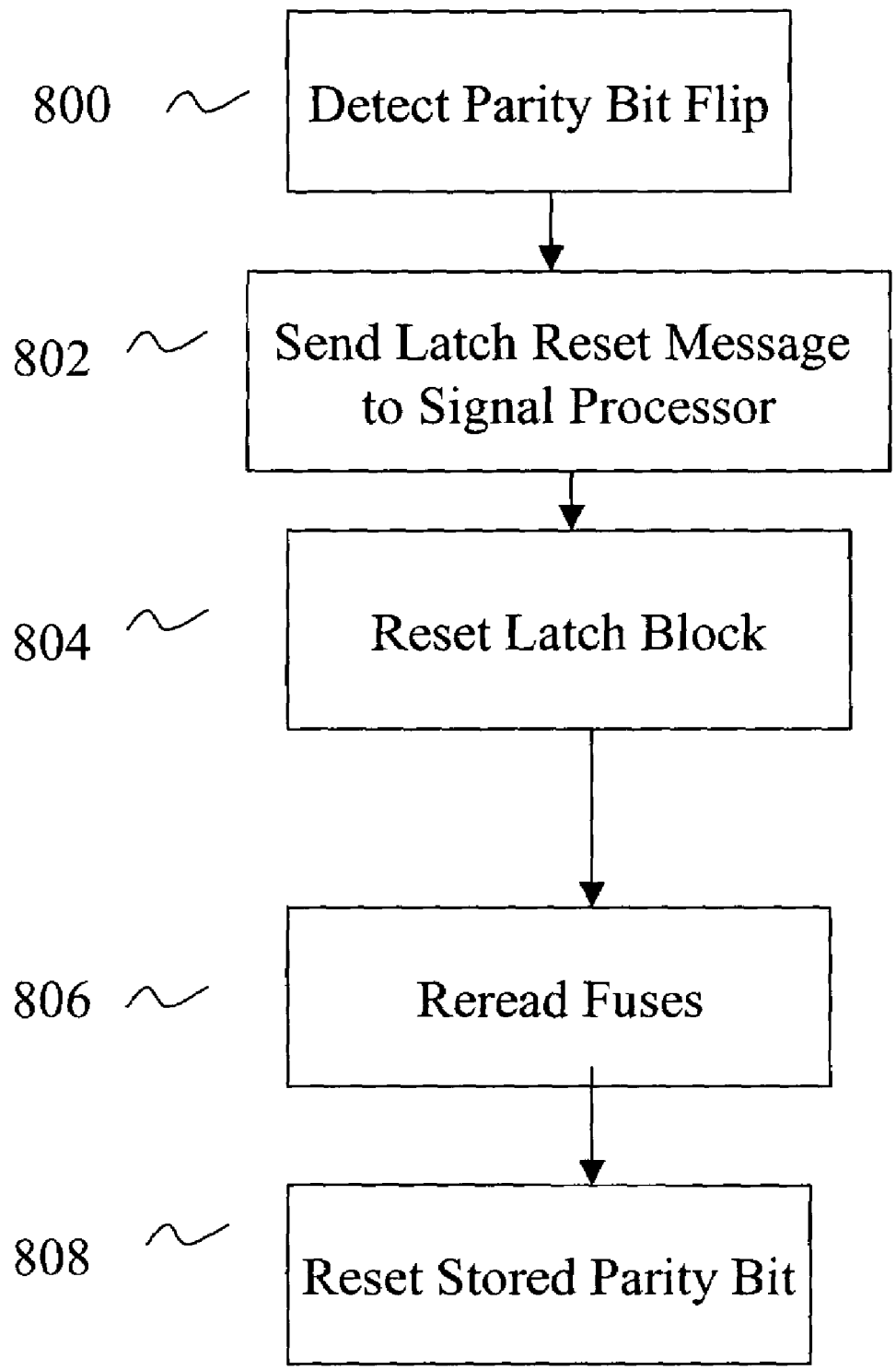
FIG. 8 illustrates a method for correction of soft errors according to an embodiment of the present invention.

FIG. 8 illustrates another embodiment of the current invention in which the readout to correct a detected soft error may be performed as soon as the latch error is generated. Comparator 90 receives signal of a parity bit flip caused by a soft error, and subsequently forwards an error signal to a nearby detector in step 800. The detector then sends instruction to a signal generator in step 802 to reset the latch block. In this case, the signal generator does not wait for an additional trigger, but immediately at step 804, sends a signal that resets all the latches in block. At step 806, it sends a further signal to reread all the associated fuses and at step 808 it resets the stored parity bit, as described above in FIG. 7.

Figure 9:
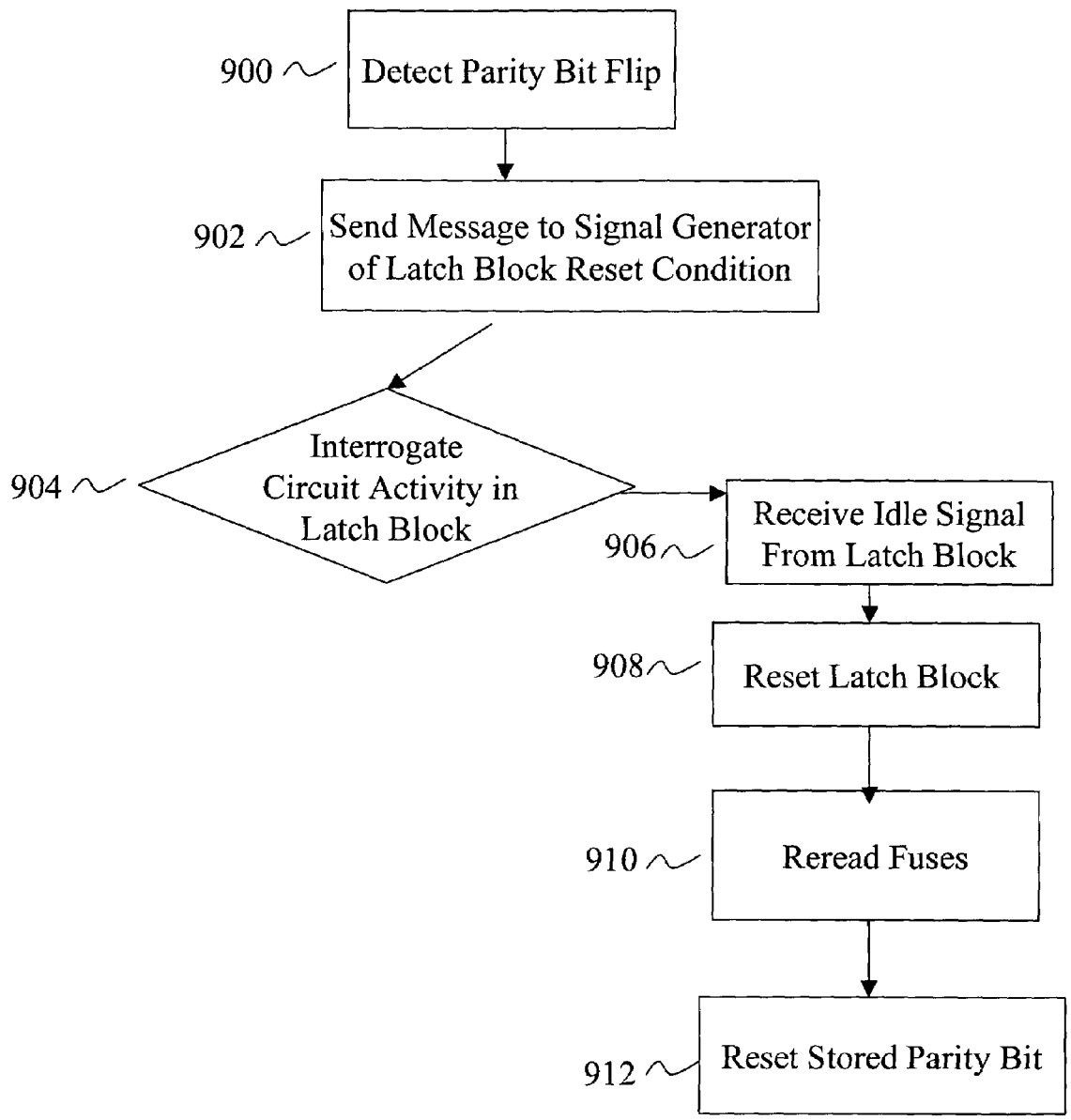
FIG. 9 illustrates a method for correction of soft errors according to an alternate embodiment of the present invention.

Other embodiments of the present invention include performing a correcting readout at the first instance after error generation when the bank of devices containing the errant latch is idle. This is illustrated in FIG. 9, whose first step is the same as in FIGS. 7 and 8. After a detector receives an error signal from comparator 90 at step 900, a signal is transmitted in step 902 to a signal generator that a latch reset condition exists in the errant fuse block. At step 904, the signal generator interrogates the circuit activity in the region of the chip containing the errant fuse block. When the fuse block circuit becomes idle, the idle status is forwarded to the signal generator at step 906, triggering it to deliver a signal to reset the latch block at step 908. At step 910 it sends a signal to reread the associated fuses. Finally, the stored parity bit is reset in step 912. The above procedure would be useful, for example in the case of chips used in servers, where it may be necessary to ensure continuous operation of computer hardware for months or years. Thus, any data errors that could potentially affect operation must be corrected properly to avoid a potentially-catastrophic consequence such as a system crash. Proper correction of data latches, in turn, is more certain when the reset is performed while the circuit is otherwise unoccupied.

Figure 10:
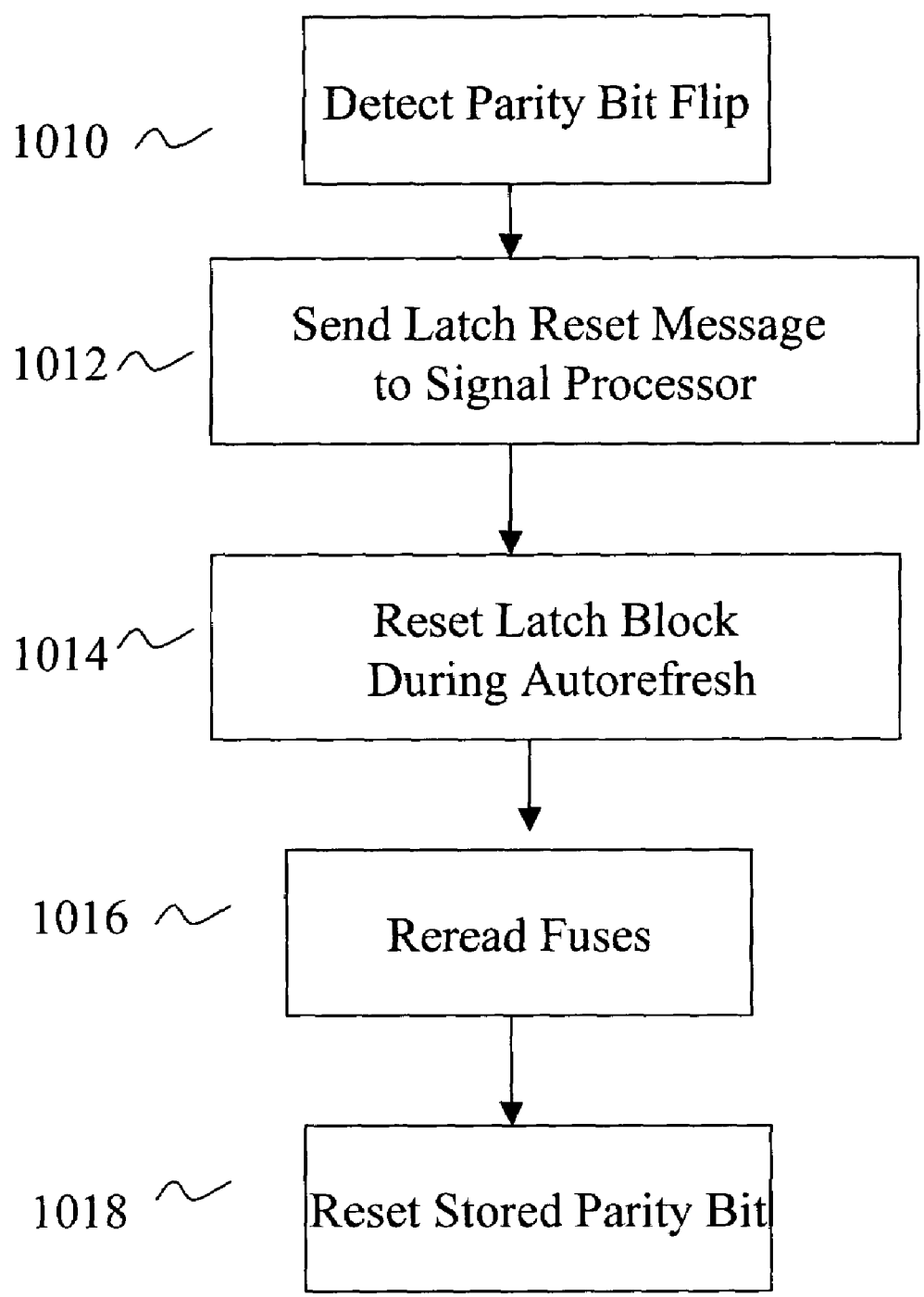
FIG. 10 illustrates a method for correction of soft errors according to still another embodiment of the present invention.

In an alternative embodiment, the fuse block could be reread according to a periodic refresh cycle, shown in FIG. 10. After a detector receives an error signal from comparator 90 at step 1010, a message is sent at step 1012 to a signal generator to reset the errant latch block during a subsequent programmed automatic refresh operation. In step 1014 during the refresh operation, the signal generator resets all the latches in the errant block. In step 1016 this is followed by the signal generator sending a reread signal to all the associated fuses of the latch block and a reset of the stored parity bit at step 1018. This results in a latch reset whose delay from the time of error generation is determined by the proximity in time of the soft error event and the next programmed refresh.

It will be appreciated by those skilled in the art that it is possible, but less likely, that more than one latch may be flipped simultaneously during a soft error event. This could occur, for instance, during an alpha particle strike, where the charge generated might be large enough to influence more than one latch. If an odd number of latches were flipped, the effect would be the same as if only one latch were flipped, and a parity bit error would be registered. However, if exactly two, (or any even number of) latches were flipped, then the output signal from the last comparator in the fuse block would result from two (or any even number of) latch upsets within the block, whose effects would cancel each other, resulting in no change in the parity bit of the latch block and thus no error detected.

Figure 11A:
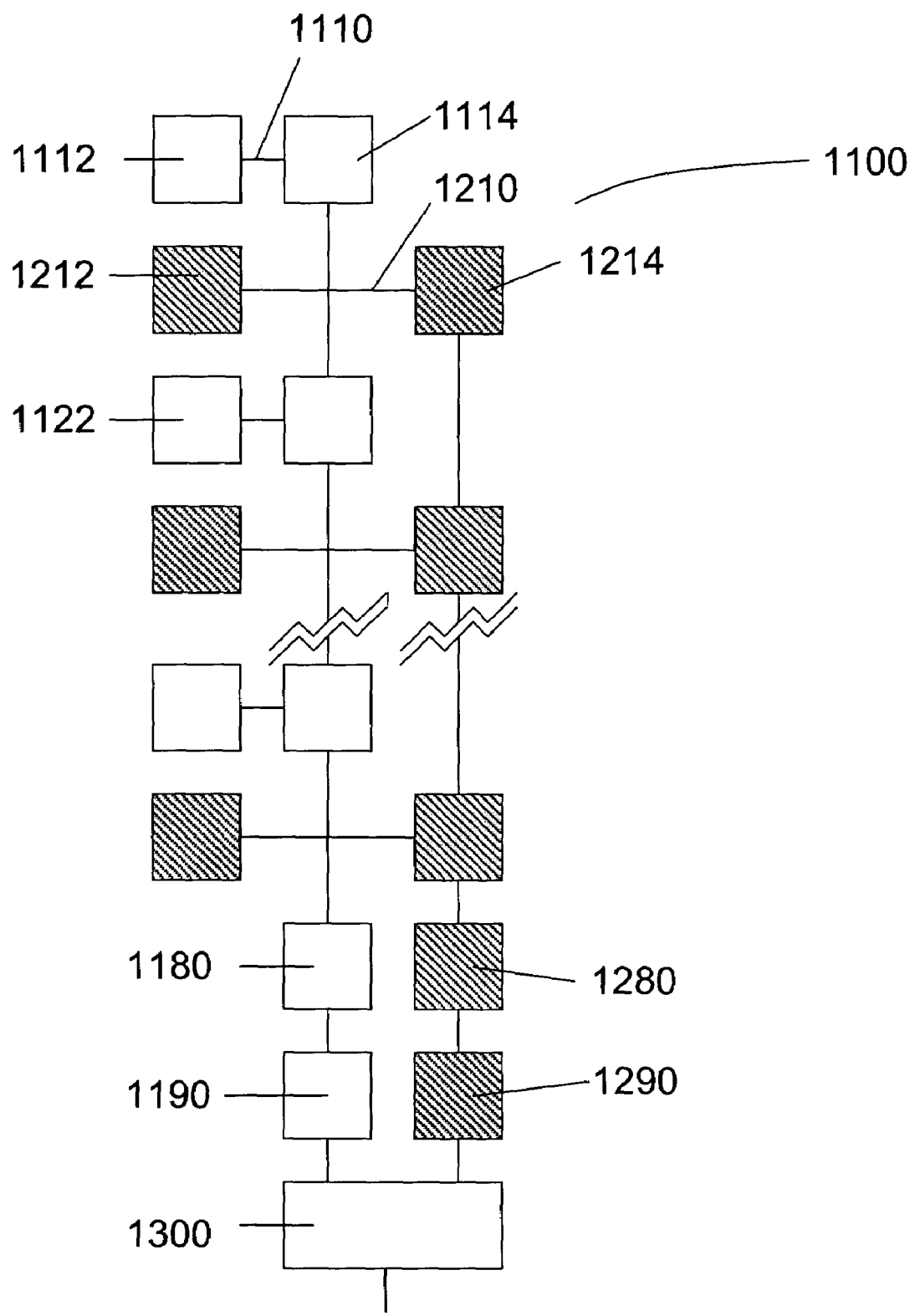
FIGS. 11a and 11b show schematics of alternative embodiments of latch circuits according to the present invention.
Figure 11B:
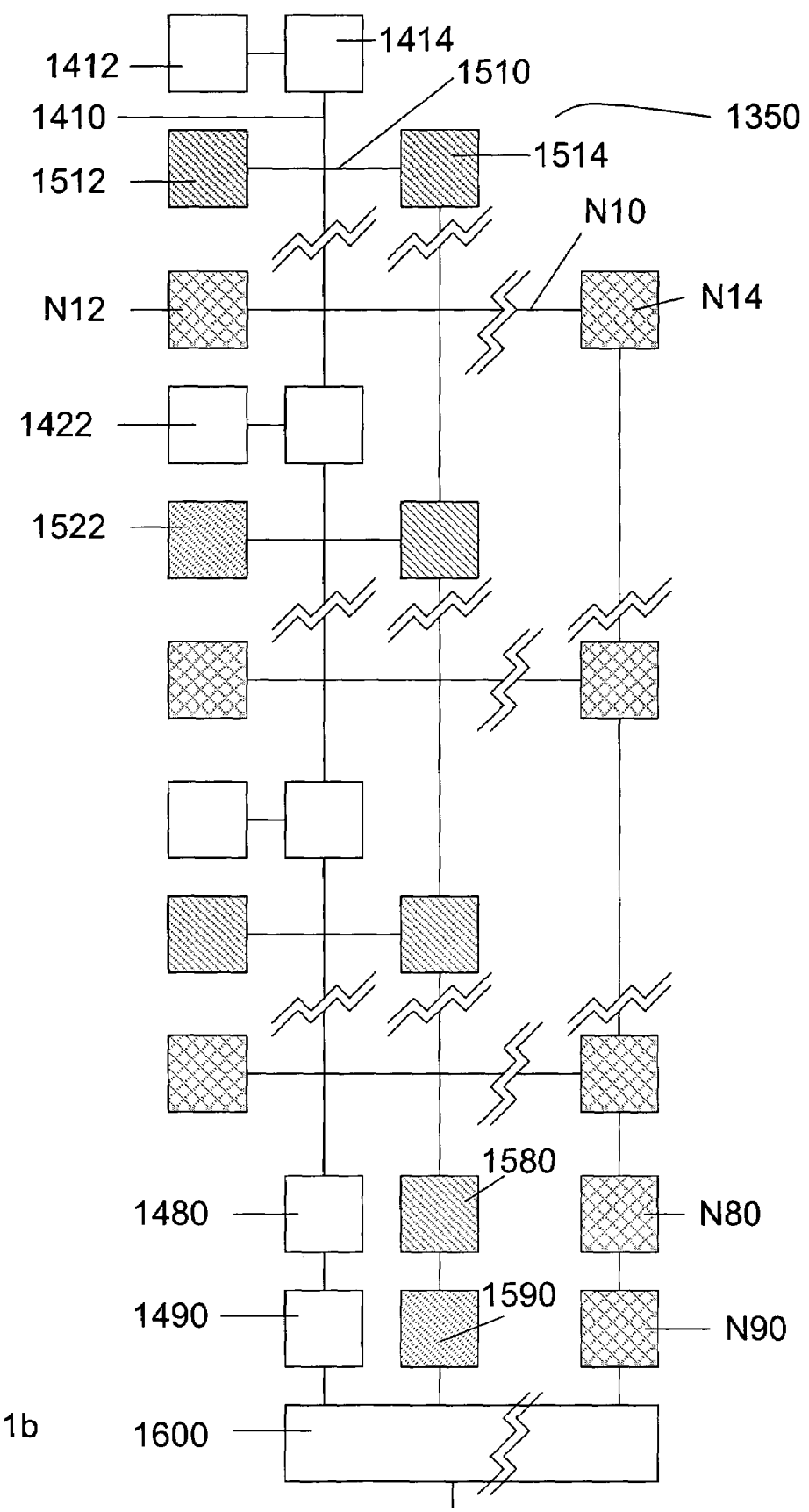

Further embodiments of the current invention, which can address this potential event, comprise a plurality of latch chains, interleaved as shown in FIGS. 11a and 11b. Each chain comprises a group of latches with respective comparators, similar to that illustrated in FIG. 6. In a preferred embodiment, each chain contains its own parity bit, which will flip when a single latch within the block sustains a soft error. Referring now to FIG. 11a, fuse latch circuit 1100 is shown, which is comprised of interleaved latch blocks 1110 and 1210. The interleaving process places latch 1112 of latch block 1110 adjacent to latch 1212 of block 1210. Additionally, latches 1112 and 1212 are placed adjacent to their respective comparators 1114 and 1214. It is to be noted that the physical interleaving of latch blocks 1110 and 1210 does not serve to electrically interconnect the two blocks. However, as shown in FIG. 11a, the interleaving process is performed so that each latch is physically bounded by two neighboring latches, both of which belong to the opposite latch block. Thus, for example, latch 1212 of block 1210 is bounded by latches 1112 and 1122, both from block 1110. When a single error is generated in either latch block, the block parity bit (1180 or 1280) where the error occurs is flipped, and fed out to the parity bit comparator (1190 or 1290, respectively). An additional circuit 1300, connected to the output from the two latch blocks, outputs an error to a detector when a parity bit flip is detected in either block.

Referring again to FIG. 6 for the case of a latch block comprising a single chain, when a large upset event occurs that causes two adjacent latches to flip at the same time, the parity bit will not register a change, and the two soft errors will remain undetected. However, for the case of two interleaved chains shown in FIG. 11a, when an upset event causes any two adjacent latches to flip, because the two adjacent latches are not electrically connected, but rather reside in separate latch blocks, the errors are recorded in separate latch chains. Thus, if a radiation strike causes soft errors in adjacent blocks 1112 and 1212, blocks 1110 and 1210 will sustain a single latch flip, which would then cause a parity bit flip in each of the respective chains. When errors are generated in three adjacent latches, one block will sustain a single upset and the other a double upset. The chain registering the single upset will experience a parity bit flip, which will be registered in circuit 1300, and can be used to generate a reset of the latch circuit, including both chains. According to the above arrangement, failure to detect a soft error would require soft error generation in at least four adjacent (sequent) latches. In the case of error generation in four sequent latches, both chains will experience an upset of two latches, which will fail to generate a parity bit flip, for the reasons discussed previously.

FIG. 11b illustrates an embodiment in which circuit 1350 comprises N interleaved chains. The chains are interleaved in a regular fashion providing a sequence of physically adjacent latches as follows: latch 1412 (and comparator 1414), first in a series from latch block 1410; latch 1512 (and comparator 1514), first in a series from block 1510; latch N12 (and comparator N14) first in a series from block N10; latch 1422 second in a series from block 1410, latch 1522, second in a series from block 1510; and so forth. Latch block 1410 is terminated with a parity bit latch 1480 and parity bit comparator 1490. Similarly each latch block is terminated with its own parity bit latch (see 1580 and N80 in latch blocks 1510 and N10, respectively) and parity bit comparator (1590 and N90 in latch blocks 1510 and N10, respectively). Any parity bit error is registered in circuit 1600. In the above manner, any given sequence of N latches in a line contains latches from all N chains. Thus, in order for two latches from the same chain to be upset, a soft error event would have to encompass at least N+1 sequent latches. Furthermore, in the event of a large latch upset, in order for circuit 1600 of fuse latch circuit 1350 to receive no parity bit errors, all chains would have to sustain upset within two, or an even number of latches. Such a condition would only be satisfied when 2N (or an integral multiple of 2N) sequent latches sustained an error. For example, in the case of three interleaved chains, this requires that exactly 6, 12, 18, etc. sequent latches flip at the same time, a much more remote possibility than the upset of one or two sequent latches.

Embodiments of devices and methods for automatic detection and correction of soft errors in latches have been described. In the foregoing description, for purposes of explanation, numerous specific details are set forth to provide a thorough understanding of the present invention. It will be appreciated, however, by one skilled in the art that the present invention may be practiced without these specific details. Furthermore, one skilled in the art can readily appreciate that the specific sequences in which methods are presented and performed are illustrative and it is contemplated that the sequences can be varied and still remain within the spirit and scope of the present invention.

In the foregoing detailed description, devices and methods in accordance with embodiments of the present invention have been described with reference to specific exemplary embodiments. Accordingly, the present specification and figures are to be regarded as illustrative rather than restrictive. The scope of the invention is to be defined by the claims appended hereto, and by their equivalents.

What is claimed is:

1. A latch block comprising:
   (a) a plurality of concatenated latch units, each latch unit comprising a latch and a comparator;
   (b) a parity bit latch connected to the comparator of a last one of the plurality of concatenated latch units; and
   (c) a parity bit comparator in communication with the parity bit latch and with the comparator of the last one of the plurality of latch units.

2. The circuit of claim 1, wherein each latch unit further comprises a fuse connected to the latch within the latch unit.

3. The circuit of claim 2, wherein the comparator is configured to operate in accordance with XOR logic functionality.

4. The circuit of claim 2, wherein each latch comprises a reset node connected to a transistor that is in series with a fuse of the latch.

5. The circuit of claim 2, wherein the parity bit latch stores a parity bit indicating whether an odd or even number of fuses within the latch is blown.

6. The circuit of claim 1, wherein the parity bit comparator flips in the event of a change in the parity bit or the parity bit latch.

7. The circuit of claim 2, wherein the parity bit comparator flips in the event of a change in the parity bit or the parity bit latch.

8. The circuit of claim 6, wherein said plurality of latch units comprise a plurality of N interleaved chains of latch units, such that, after a single strike event, a parity bit flip occurs after any number except a multiple of 2N of simultaneous latch errors within the latch block, said simultaneous latch errors being distributed as a multiple of two latch errors in each of N blocks.

9. The circuit of claim 7 wherein said plurality of successive latch units comprise a plurality of N interleaved chains of latch units, such that, after a single strike event, a parity bit flip occurs after any number except a multiple of 2N of simultaneous latch errors within the latch block, said simultaneous latch errors being distributed as a multiple of two latch errors in each of N blocks.

10. A circuit, comprising:
   (a) a latch block including a plurality of successive latch units, each latch unit comprising a latch and a comparator;
   (b) a parity bit latch connected to the comparator of a last one of the plurality of concatenated latch units;
   (c) a parity bit comparator in communication with the parity bit latch and with the comparator of the last one of the plurality of latch units;
   (d) a detector connected to the output of the parity bit comparator; and
   (e) a signal-generating device connected to the detector, wherein signals to reset the latch block are produced upon detection of the parity bit flip.

11. The circuit of claim 9, wherein each latch unit further comprises a fuse element connected to the latch within the latch unit.

12. The circuit of claim 9, wherein the plurality of successive latch units comprise a plurality of N interleaved chains of latch units, such that, after a single strike event, a parity bit flip occurs after any number except a multiple of 2N of simultaneous latch errors within the latch block, said multiple of 2N of simultaneous latch errors being distributed as a multiple of two latch errors in each of N blocks.

13. The circuit of claim 10, wherein the plurality of successive latch units comprise a plurality of N interleaved chains of latch units, such that a parity bit flip occurs after any number except for a multiple of 2N of simultaneous latch errors within the latch block, said multiple of 2N of simultaneous latch errors being distributed as a multiple of two latch errors in each of N blocks.

14. A method for automatically detecting latch soft errors in a latch block, comprising:
   (a) arranging a series of latch units, each latch unit comprising a latch and a comparator, such that a comparator of at least one latch unit receives input from a comparator of a preceding latch unit and input from its associated latch;
   (b) monitoring an output of a comparator of a final latch unit using a parity bit comparator;
   (c) monitoring an output of a latch used to store output of the comparator of the final latch unit using the parity bit comparator; and
   (d) detecting a parity bit flip by receiving a change in the output of the parity bit comparator.

15. The method of claim 14, further comprising:
   (a) sending a message indicating a parity bit flip to a signal generator;
   (b) sending a signal to reset the latches to a default value in response to the message;
   (c) resetting of the latch used to store the output of the comparator of the final latch unit; and
   (d) rereading all fuses associated with the latch units.

16. The method of claim 14, further comprising:
   (a) notifying a signal generator of a latch reset condition;
   (b) interrogating the activity in circuitry associated with the fuse block;
   (c) receiving an idle status signal from circuitry associated with the fuse block;
   (d) sending a signal to reset the latches to a default value;
   (e) resetting the latch used to store the output of the comparator of the final latch unit; and
   (f) rereading all fuses associated with the latch units.

17. The method of claim 15, wherein the signal generator sends a signal to reset the latches immediately upon receiving a parity bit flip message.

* * * * *